(12) United States Patent
Mukhopadhyay et al.

(10) Patent No.: US 8,218,259 B2
(45) Date of Patent: Jul. 10, 2012

(54) HIGH-SPEED, LOW-POWER DRIVER SYSTEM

(75) Inventors: Rajarshi Mukhopadhyay, Richardson, TX (US); Pankaj Pandey, McKinney, TX (US); Reza Sharifi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 12/729,183

(22) Filed: Mar. 22, 2010

(65) Prior Publication Data
US 2010/0237910 A1 Sep. 23, 2010

Related U.S. Application Data

(60) Provisional application No. 61/162,067, filed on Mar. 20, 2009.

(51) Int. Cl.
*G11B 5/02* (2006.01)
*G11B 5/09* (2006.01)
(52) U.S. Cl. .............................. 360/68; 360/46
(58) Field of Classification Search ............... None
See application file for complete search history.

(56) References Cited

U.S. PATENT DOCUMENTS

| | | | |
|---|---|---|---|
| 2004/0070862 A1* | 4/2004 | Ranmuthu | 360/68 |
| 2005/0007164 A1* | 1/2005 | Callahan, Jr. | 327/133 |
| 2005/0094305 A1* | 5/2005 | Kuehlwein et al. | 360/68 |
| 2005/0117244 A1* | 6/2005 | Ranmuthu | 360/68 |
| 2007/0268803 A1* | 11/2007 | Hsu et al. | 369/99 |

\* cited by examiner

*Primary Examiner* — Daniell L Negron
*Assistant Examiner* — Regina N Holder
(74) *Attorney, Agent, or Firm* — John J. Patti; Wade J. Brady, III; Frederick J. Telecky, Jr.

(57) ABSTRACT

A reduced power driver is described. This reduced power driver comprises: an input current driver for transmitting a current signal that is a fraction of a DC current signal; a first resistor coupled at one end to a first voltage supply; a first current driver coupled to the input current driver and a first switch control; a second switch coupled a first current driver output, another end of the first resistor, and the output control; a dynamic booster coupled between the first voltage supply and the output control; and wherein the reduced power driver is operative for selectively adding an overshoot current to the output control so that power consumption is reduced, while synchronizing the DC current signal with the overshoot current.

9 Claims, 10 Drawing Sheets

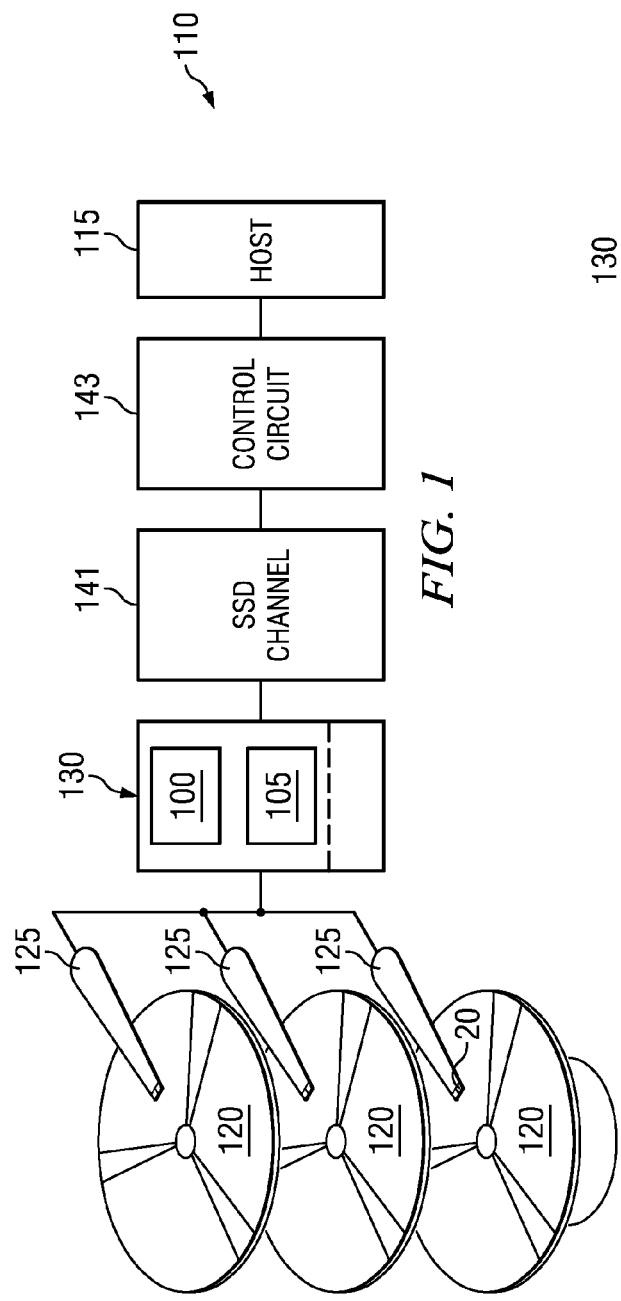
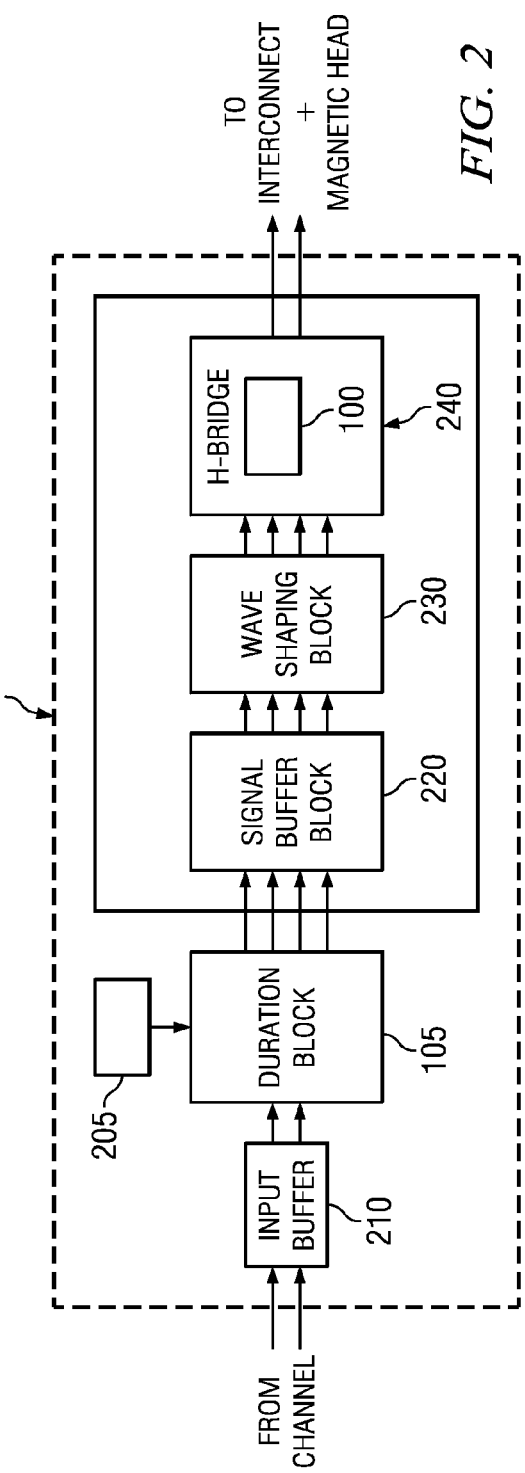

FIG. 7A

| DURDAC | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| STAGE 1 PCNTL<0> | 0 | 0 | 0 | 0 | 0 | 0 | 0 | 0 | 0 | 0 | 0 | 0 | 0 | 0 | 0 | 0 |
| PCNTL<1> | 0 | 0 | 0 | 0 | 0 | 0 | 0 | 0 | 0 | 0 | 0 | 0 | 0 | 0 | 1 | 1 |
| NCNTL<0> | 1 | 1 | 1 | 1 | 1 | 1 | 1 | 1 | 1 | 1 | 1 | 1 | 1 | 1 | 1 | 1 |
| NCNTL<1> | 1 | 1 | 1 | 1 | 1 | 1 | 1 | 1 | 1 | 1 | 1 | 1 | 1 | 1 | 0 | 0 |
| STAGE 2 PCNTL<2> | 0 | 0 | 0 | 0 | 0 | 0 | 0 | 0 | 0 | 0 | 0 | 0 | 0 | 0 | 0 | 0 |
| PCNTL<3> | 0 | 0 | 0 | 0 | 0 | 0 | 0 | 0 | 0 | 0 | 0 | 0 | 0 | 0 | 1 | 1 |
| NCNTL<2> | 1 | 1 | 1 | 1 | 1 | 1 | 1 | 1 | 1 | 1 | 1 | 1 | 1 | 1 | 1 | 1 |
| NCNTL<3> | 1 | 1 | 1 | 1 | 1 | 1 | 1 | 1 | 1 | 1 | 1 | 1 | 1 | 1 | 0 | 0 |
| STAGE 3 PCNTL<4> | 0 | 0 | 0 | 0 | 0 | 0 | 0 | 0 | 0 | 0 | 0 | 0 | 0 | 0 | 0 | 0 |
| PCNTL<5> | 0 | 0 | 0 | 0 | 0 | 0 | 0 | 0 | 0 | 0 | 0 | 0 | 1 | 1 | 1 | 1 |
| NCNTL<4> | 1 | 1 | 1 | 1 | 1 | 1 | 1 | 1 | 1 | 1 | 1 | 1 | 1 | 1 | 1 | 1 |
| NCNTL<5> | 1 | 1 | 1 | 1 | 1 | 1 | 1 | 1 | 1 | 1 | 1 | 1 | 0 | 0 | 0 | 0 |
| STAGE 4 PCNTL<6> | 0 | 0 | 0 | 0 | 0 | 0 | 0 | 0 | 0 | 0 | 0 | 0 | 0 | 0 | 0 | 0 |
| PCNTL<7> | 0 | 0 | 0 | 0 | 1 | 1 | 1 | 1 | 1 | 1 | 1 | 1 | 1 | 1 | 1 | 1 |
| NCNTL<6> | 1 | 1 | 1 | 1 | 1 | 1 | 1 | 1 | 1 | 1 | 1 | 1 | 1 | 1 | 1 | 1 |
| NCNTL<7> | 1 | 1 | 1 | 1 | 0 | 0 | 0 | 0 | 0 | 0 | 0 | 0 | 0 | 0 | 0 | 0 |
| STAGE 5 PCNTL<8> | 0 | 0 | 0 | 0 | 0 | 0 | 0 | 0 | 0 | 0 | 0 | 0 | 0 | 0 | 0 | 0 |
| PCNTL<9> | 0 | 0 | 0 | 0 | 0 | 1 | 1 | 1 | 1 | 1 | 1 | 1 | 1 | 1 | 1 | 1 |
| NCNTL<8> | 1 | 1 | 1 | 1 | 1 | 1 | 1 | 1 | 1 | 1 | 1 | 1 | 1 | 1 | 1 | 1 |
| NCNTL<9> | 1 | 1 | 1 | 1 | 1 | 0 | 0 | 0 | 0 | 0 | 0 | 0 | 0 | 0 | 0 | 0 |
| STAGE 6 PCNTL<10> | 0 | 0 | 0 | 0 | 0 | 0 | 0 | 0 | 0 | 0 | 0 | 0 | 0 | 0 | 0 | 0 |
| PCNTL<11> | 0 | 0 | 0 | 1 | 1 | 1 | 1 | 1 | 1 | 1 | 1 | 1 | 1 | 1 | 1 | 1 |
| NCNTL<10> | 1 | 1 | 1 | 1 | 1 | 1 | 1 | 1 | 1 | 1 | 1 | 1 | 1 | 1 | 1 | 1 |
| NCNTL<11> | 1 | 1 | 1 | 0 | 0 | 0 | 0 | 0 | 0 | 0 | 0 | 0 | 0 | 0 | 0 | 0 |
| STAGE 7 PCNTL<12> | 0 | 0 | 0 | 0 | 0 | 0 | 0 | 0 | 0 | 0 | 0 | 0 | 0 | 0 | 0 | 0 |
| PCNTL<13> | 0 | 0 | 1 | 1 | 1 | 1 | 1 | 1 | 1 | 1 | 1 | 1 | 1 | 1 | 1 | 1 |
| NCNTL<12> | 1 | 1 | 1 | 1 | 1 | 1 | 1 | 1 | 1 | 1 | 1 | 1 | 1 | 1 | 1 | 1 |
| NCNTL<13> | 1 | 1 | 0 | 0 | 0 | 0 | 0 | 0 | 0 | 0 | 0 | 0 | 0 | 0 | 0 | 0 |
| STAGE 8 PCNTL<14> | 0 | 0 | 0 | 0 | 0 | 0 | 0 | 0 | 0 | 0 | 0 | 0 | 0 | 0 | 0 | 0 |
| PCNTL<15> | 0 | 1 | 1 | 1 | 1 | 1 | 1 | 1 | 1 | 1 | 1 | 1 | 1 | 1 | 1 | 1 |
| NCNTL<14> | 1 | 1 | 1 | 1 | 1 | 1 | 1 | 1 | 1 | 1 | 1 | 1 | 1 | 1 | 1 | 1 |
| NCNTL<15> | 1 | 0 | 0 | 0 | 0 | 0 | 0 | 0 | 0 | 0 | 0 | 0 | 0 | 0 | 0 | 0 |

DATA RATE →

HIGH-SPEED, LOW-POWER DRIVER SYSTEM

CROSS REFERENCE TO RELATED APPLICATION(S)

The present application claims priority to jointly owned U.S. Provisional Application corresponding to application No. 61/162,067 entitled "Techniques for Fast Preamplifier Writer". This provisional application was filed on Mar. 20, 2009.

DESCRIPTION OF RELATED ART

With the evolution of electronic devices, there is a continual demand for enhanced speed, capacity and efficiency in various areas including electronic data storage. Motivators for this evolution may be the increasing interest in video (e.g., movies, family videos), audio (e.g., songs, books), and images (e.g., pictures). Hard disk drives have emerged as one viable solution for supplying high capacity storage by effectively reading and writing data from an associated magnetic media. As the densities of magnetic media increases, it becomes increasingly important that both the writing process and the reading process can accommodate increasing data rates, without sacrificing data integrity. Consequently, there remain unmet needs relating to data storage devices.

BRIEF DESCRIPTION OF THE DRAWINGS

The high-speed, low-power driver system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

FIG. 1 is an environmental drawing of a high-speed, low-power, driver system with a reduced power driver (RPD) and a duration-block of a data storage system.

FIG. 2 is block diagram of a preamplifier writer with the RPD and the duration block.

FIG. 7A is a table illustrating a scheme for regulating power and duration of the duration block of FIG. 6A.

Figure 3:
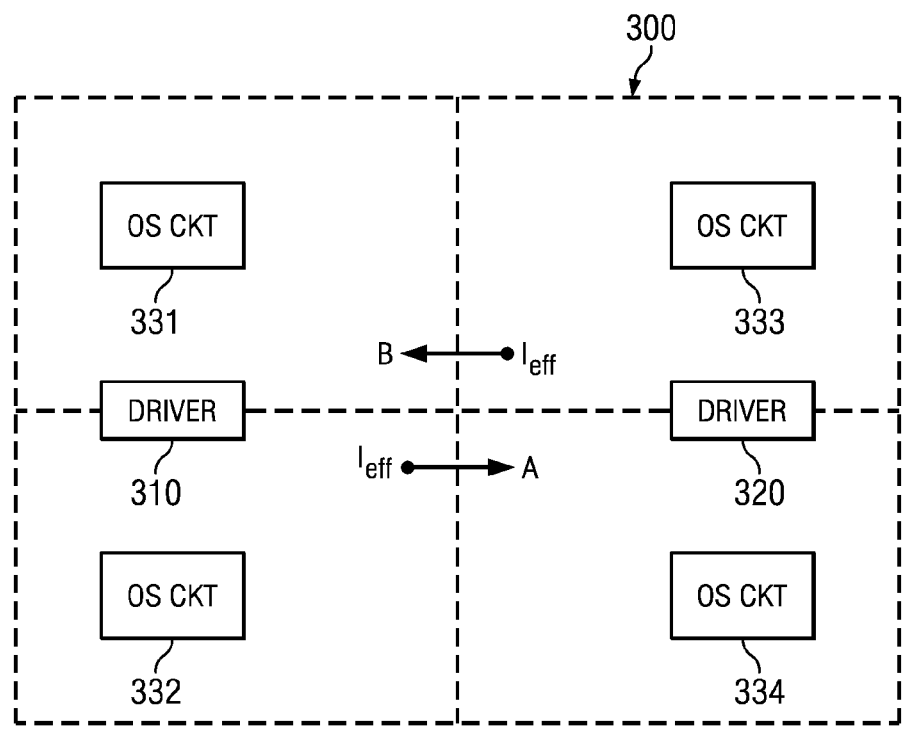
FIG. 3 is a block diagram of an H-Bridge within the preamplifier of FIG. 2 illustrating to two reduced power drivers.

While the high-speed, low-power, driver system is susceptible to various modifications and alternative forms, specific embodiments have been shown by way of example in the drawings and subsequently are described in detail. It should be understood, however, that the description herein of specific embodiments is not intended to limit the high-speed, low-power, driver system to the particular forms disclosed. In contrast, the intention is to cover all modifications, equivalents, and alternatives falling within the spirit and scope of the reduced power driver as defined by this document.

DETAILED DESCRIPTION OF EMBODIMENTS

As used in the specification and the appended claim(s), the singular forms "a", "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

FIG. 1 is an environmental drawing of a high-speed, low-power driver system illustrating a reduced power driver (RPD) 100 and a duration-block 105 of a data storage system 110. A host 115 (e.g., a computer system) may initiate commands that facilitate storing or retrieving data from a media 120 (e.g., a magnetic platter). In this implementation, the data storage system 110 may have a head 125 associated with each media 120 used during data storage or retrieval. If data is represented as magnetic transitions on this media, the heads 125 may be magneto-resistive heads for reading or writing data by passing current through them.

A preamplifier 130 is the interface between the heads 125 and the remaining components within the data storage system 110. This preamplifier amplifies signals received from input channels. The synchronously sampled data channel 141 and the control circuit 143 may process data signals and control operations associated with the data storage process. By including the RPD 100 within the preamplifier 130, the amount of power consumed by the data storage system 100 may be substantially reduced.

FIG. 2 is block diagram of the preamplifier 130 with the RPD 100 and the duration block 105. This block diagram illustrates one of many implementations of the preamplifier 130. This preamplifier includes an input buffer 210 that receives an external data signal from, for example, the host 115. After receiving the external data signal, this input buffer may "clean" the data signal by removing unwanted frequencies and transmit amplified, cleaned signal to the duration block 105. This block produces pulses that create a direct current (DC) current signal and an overshoot current signal. A control block 205 may control when the duration block 105 produces pulses. In one implementation, this control block may be a digital to analog converter (DAC), but other implementations are also possible.

A signal buffer block 220 may also clean the pulsed signals received from the duration block 105. This block may differ from the cleaning in the duration block in that it is located close to 230 in layout. After amplifying the cleaned signals, the signal buffer block transmits the signals to the wave shaping block 230. This block may process the received signals in a way that makes them compatible for the H-Bridge 240. This H-Bridge may transmit the data signal that goes to the head 125 and gets written onto the media 120. The H-Bridge 240 includes the RPD 100, which reduces power consumed during a write operation. This power reduction can correspondingly reduce the overall power consumed by the preamplifier 130.

FIG. 3 is a block diagram of the H-Bridge 300 (which may correspond to H-bridge 240 within the preamplifier 130) is illustrated having two reduced power drivers 310 and 320. The H-Bridge 300 may be divided into four quadrants that each includes an overshoot circuit, such as overshoot circuits 331-334. While this block diagram is symmetric implementation with two writer half cells, other implementations are equally applicable. These overshoot circuits and the driver circuits 310-320 may work collaboratively in creating an effective current signal $I_{eff}$ that may be used in writing data to the media 120. For example, overshoot circuit 331, driver 310, and overshoot circuit 334 may write a digital zero by creating an effective current Ieff that travels in the direction A and is a sum of the overshoot current and the direct current. In contrast, the other driver and overshoot circuits within the H-Bridge 300 may be used in writing a digital one by creating an effective current $I_{eff}$ that travels in the direction B. Consequently, the reduced power driver 100 makes also is effective in synchronizing the overshoot current with the direct current, which means that data may be effectively written.

Either one or both of the drivers 310, 320 may be a reduced power driver (RPD) 100. In one implementation, these drivers may be a reduced power, class AB driver that can either sink current or source current. For this implementation, the RPD In a preamplifier writer, the Class AB driver is the bottleneck for achieving fast rise/fall times (Tr/Tf). The class AB driver is slow because of the huge resistor-capacitor (RC) parasitics placed at its input and internal biasing nodes. To speed up the Tr/Tf, one possible way is to increase the bias currents through the input stages of the class AB. However, power consumption increases significantly. Alternatively, either the driver 310 or the driver 320 may be drivers include current drivers that either sink or source current.

Figure 4A:
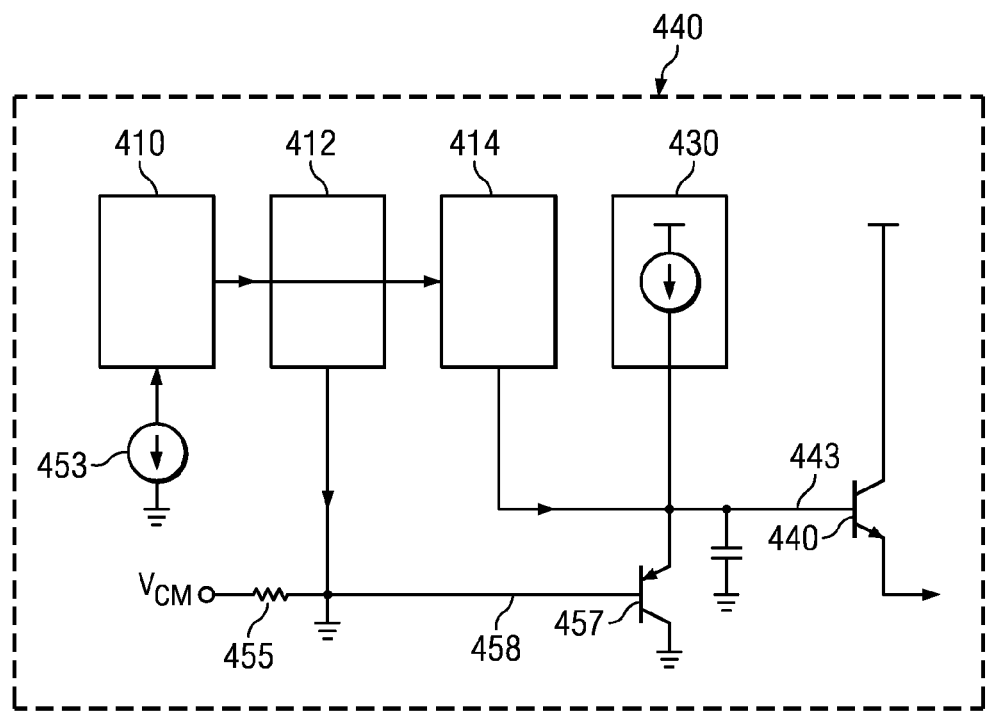
FIG. 4A is a block diagram illustrating a half-circuit of driver that may be either one of the drivers that is the reduced power driver.

FIG. 4A is a block diagram illustrating a driver 400 that may be either one of the drivers 310, 320 that is the reduced power driver 100. The driver 400 includes an input current driver 410, a current driver 412, current driver 414, dynamic booster 430, and an output switch 440. As indicated by the arrows, current may flow from the input current driver 410 through the current drivers 412, 414 to a control 443 for the output switch 440. In this implementation, the output switch is a bipolar transistor so that the control 443 is the base of the transistor. However, another implementation may result from using a different transistor methodology.

A current source 453 supplies current to the input current driver 410. In one implementation the current source 453 may supply current that is a ratio of the direct current signal, such as IDC/M. For this implementation, the input current driver 410 receives the current signal IDC/M and transmits a current signal IDC/N that gets sent to the current mirror 420 (transistors 461 and 465 shown in FIG. 4B). For this implementation, M and N may be coefficients where that represent M>N.

The driver 400 also includes a resistor 455 and a switch 457 that connects to a control 458 for the output switch 440. Since the switch 457 connects between this control and to a low voltage supply, this switch can pull the control 443 towards the low voltage supply when the switch 457 is active. The resistor 455 may connect to a common mode voltage source $V_{CM}$ and the control 458. In one implementation, this resistor may be a matching resistor sized to match characteristics impedance of interconnect (z0) that connects preamplifier writer to magnetic head. For example, impedances of the resistor may be like [N*{(z0/2)+(Magnetic Head Resistance/2)}]. Since the current driver 412 may also transmit a current signal to the control for the switch 457 that may either open or close this switch. Since the current driver 412 connects to this control, the resistor 455, the current driver 412 may transmit a current signal IDC/N to the current driver 414.

This current driver 414 and the dynamic booster 430 both produce a signal at the control 443. More specifically, the current driver 414 may function as a "feed forward" device that applies a current signal at the control 443, which is a ratio of the current signal received from the current driver 412. Consequently including the current driver 414 facilitates making the direct current signal applied at the control 443 programmable, which helps synchronize the direct current signal with the overshoot current signal. The dynamic booster 430 applies a voltage boost to the control the control 457, which may selectively increase the direct current signal by adding an overshoot current signal. The dynamic boost helps to speed up the Class AB driver and also helps with synchronization between the direct current signal and the overshoot current signal. However, the selective nature dynamic booster 430 allows the benefit, while reducing power consumption of the driver 400. For example, the dynamic booster 430 may only be active for high data rate operation where fast rise/fall times are essential and can be inactive for low data rate operation for power savings or the like.

Figure 4B:
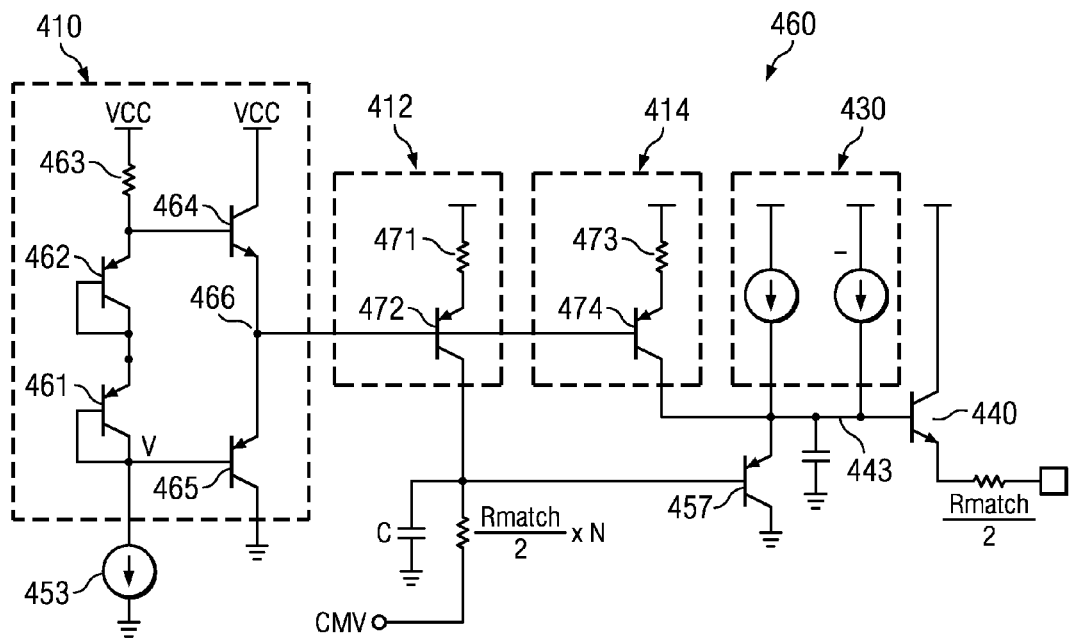
FIG. 4B is a circuit diagram of half-circuit of the reduced power driver of FIG. 4A illustrating a input current driver and other current drivers.

FIG. 4B is a circuit diagram 460 of half-circuit of the reduced power driver of FIG. 4A illustrating the input current driver 410 and other current drivers 412, 414. The input current driver includes two diode connected switches 461, 462, resistor 463, and two switches 464, 465 that connect to an output node 466. The switch 465 may be twice as large as the size of the switch 461, which enables current multiplication to scale up the current in steps until it reaches the output device 440. In this implementation, the current driver 412 includes a resistor 471 in series with the switch 472. Similarly, the current driver 414 includes a resistor 473 in series with the switch 472. The components within the current drivers 412, 414 are one of many possible implementations. For example, an alternative implementation may result for making either one of these current drivers a current mirror. When the switch 474 is closed, the current driver 414 can begin pulling the control 443 toward a high voltage supply, as described above with reference to the feed forward technique.

Figure 4C:
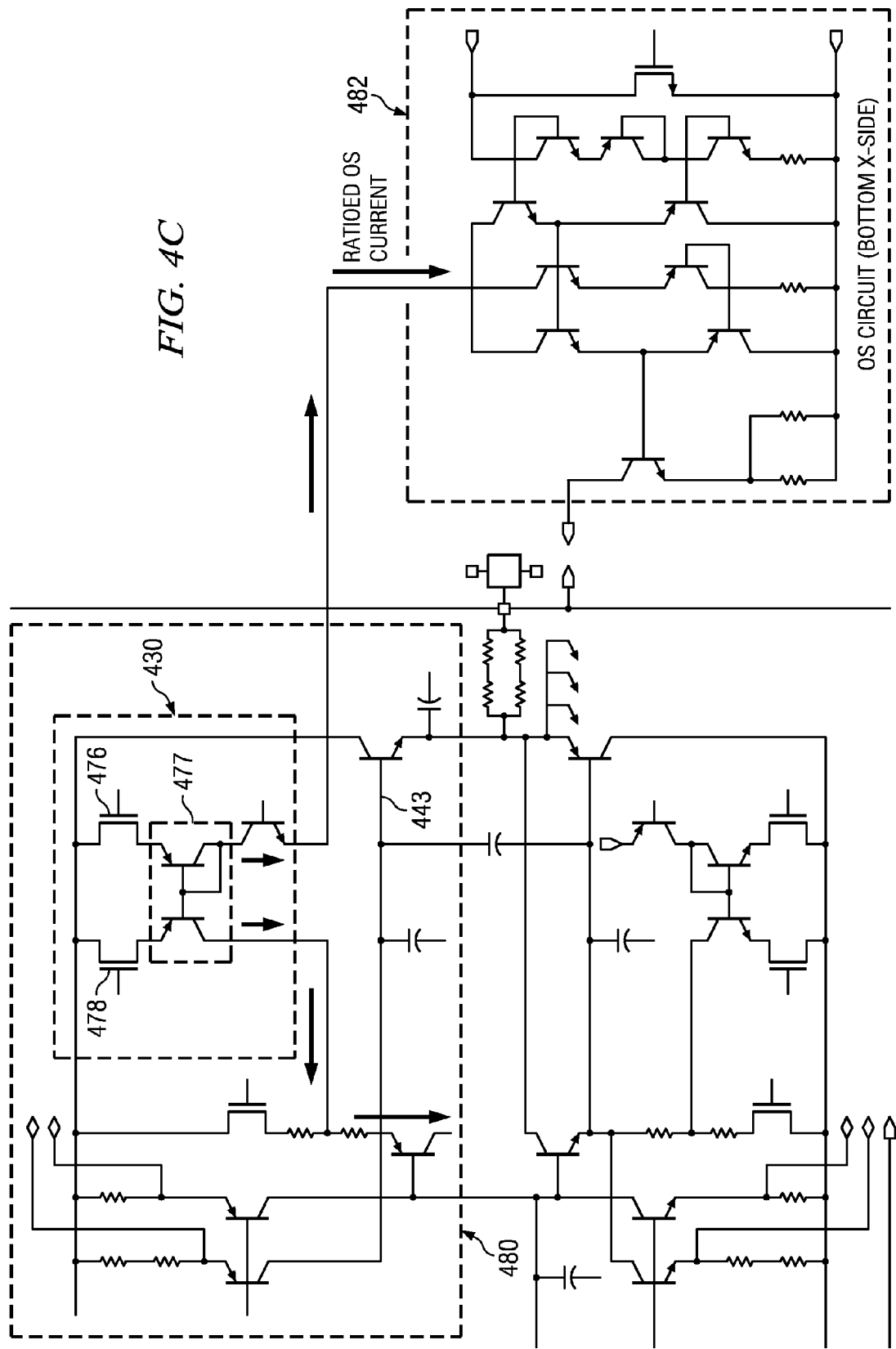
FIG. 4C is a circuit diagram of a half of the H-Bridge of FIG. 3 illustrating a circuit for the dynamic booster of FIG. 4B.

FIG. 4C is a circuit diagram of a half of the H-Bridge 300 illustrating a circuit 470 for the dynamic booster 430. This circuit is a part of a driver 480, which may be either the driver 310 or the driver 320, or both of these drivers. The dynamic booster 470 may include any number of devices of varying transistor methodologies, such as cascode device or current mirror 477. This circuit may be either overshoot circuit 331 or overshoot circuit 334 when the driver 480 is the driver 310. Alternatively, the circuit 482 may be either the overshoot circuit 332 or the overshoot circuit 333 when then the driver 480 is the driver 320. By using a ratio of the overshoot current from opposite sections of the H-Bridge 300, the RPD 100 maintains the same polarity, is beneficial because it helps in synchronizing the currents between the 2 halves of the H-Bridge. This also provides increased headroom for the booster circuit. In this implementation the circuit 482, generates a ratio of the overshoot current, alternative implementations may result by reusing currently existing currents.

The implementation of the dynamic booster 470 includes numerous switches that enable its selective operation. More specifically, this dynamic booster uses metal oxide semiconductor field effect (MOSFET) transistors 475 and 476 for adding programmability of when this booster operates. For example, the dynamic booster 470 may be switched off for low data rates and low power applications, while it may be on for high data rates with low rise/fall times. When both the devices 475 and 476 are active, a current mirror 477 may route a current from the cascode device 472 to the control 443. This current mirror may be a fast bipolar mirror.

Figure 5A:
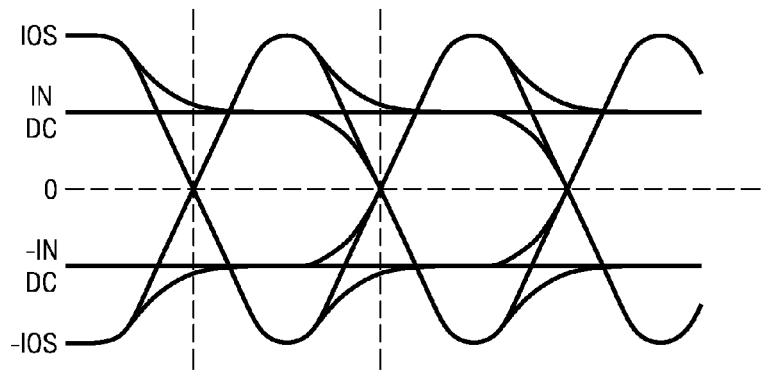
FIGS. 5A-5B are graphical displays illustrating the correlation between current and time for a DC current and an overshoot current.
Figure 5B:
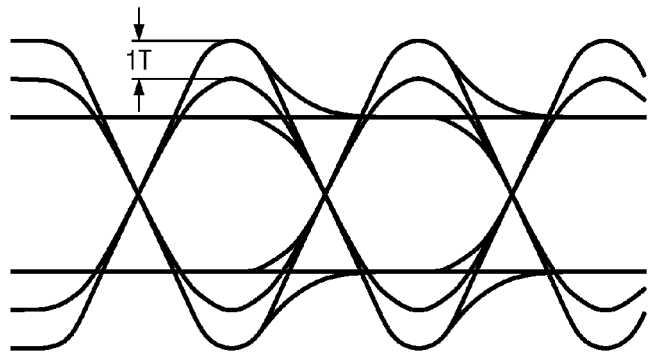

FIGS. 5A-5B are graphical displays illustrating the correlation between current and time for a DC current and an overshoot current for the RPD 100. These figures demonstrate an eye pattern resulting form super-imposing bit-cell patterns. FIG. 5A demonstrates the eye pattern for a fast writer with the RPD 100, or a writer with a data on the order of approximately 3 Gbps. In contrast, the FIG. 5B demonstrates the eye pattern for a slow writer with the RPD 100, or a writer with a data on the order of approximately 3 Gbps. In comparing these figures, the eye pattern in FIG. 5B is smaller than the eye in FIG. 5A. From these plots, the RPD 100 is beneficial because smaller rise/fall time enables the eye to be open (programmed overshoot current is reached) and reduces overshoot current variation.

The cascode device 472 may receive a ratio of the overshoot current from, for example, the circuit 482 and substantially reduce any parasitic capacitances associated with routing signals, which may adversely impact either rise and fall times associated with a write data signal. Reducing these times are particularly beneficial as data rates increase from approximately 1 Gbps to approximately 3.5 Gbps. Instead of these higher data rates result in a greater rate of errors in writing data, or a greater bit error rate, the RPD 100 with the current driver 414 that operates as a feed forward device and the dynamic booster 430 reduce the bit error rate and improves signal integrity. Moreover, the RPD 100 also reduces adjacent track interference where data on an adjacent track gets corrupted by reducing the parasitic capacitances associated with routing data.

The OS current to be fed into the class AB driver can be derived from a point in the OS circuit such that the delay from the point where the OS current for dynamic boosting is derived to the output writer current, matches the delay from the point where dynamic boosting is performed (Node 443) to the output writer current. In such a case, both DC & OS currents start at the same time, so synchronization improves, and hence are more effective in reducing the Tr/Tf.

Figure 6A:
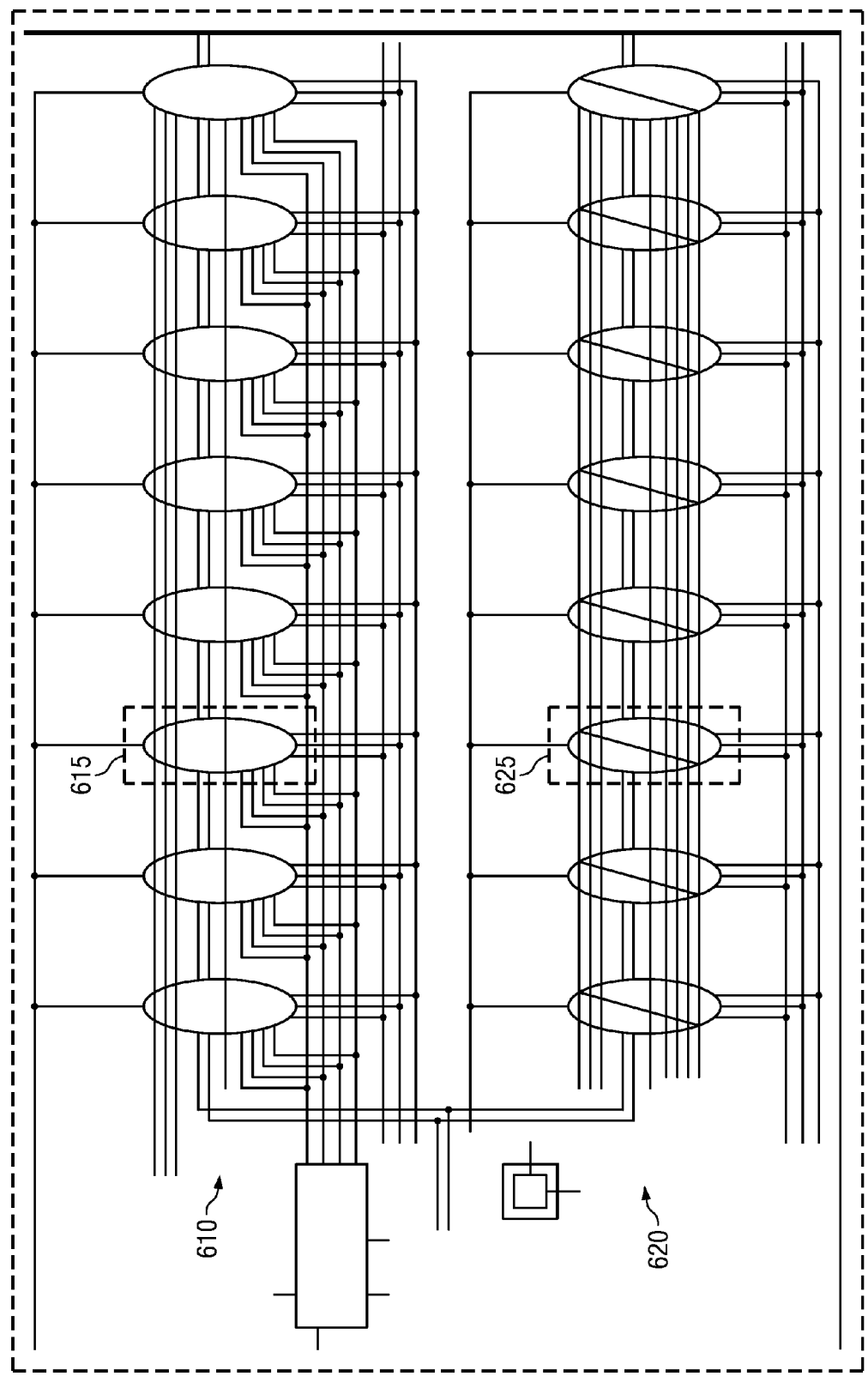
FIG. 6A is a circuit diagram illustrating one implementation of the efficient duration block of FIG. 2 with eight delay stages and eight non-delay stages.
Figure 6B:
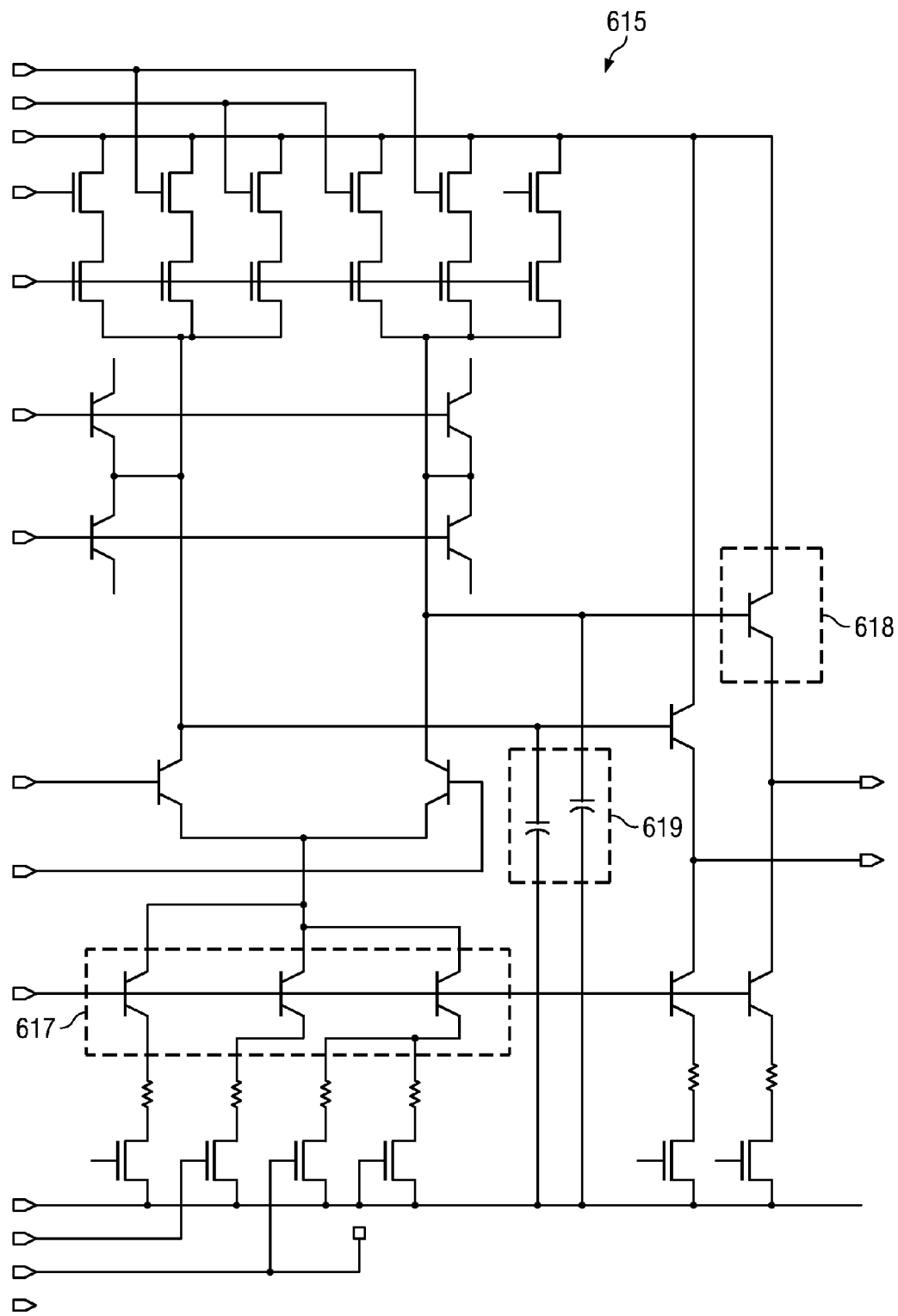
FIGS. 6B-6C are circuit diagrams illustrating an implementation of a delay stage and a non-delay stage.
Figure 6C:
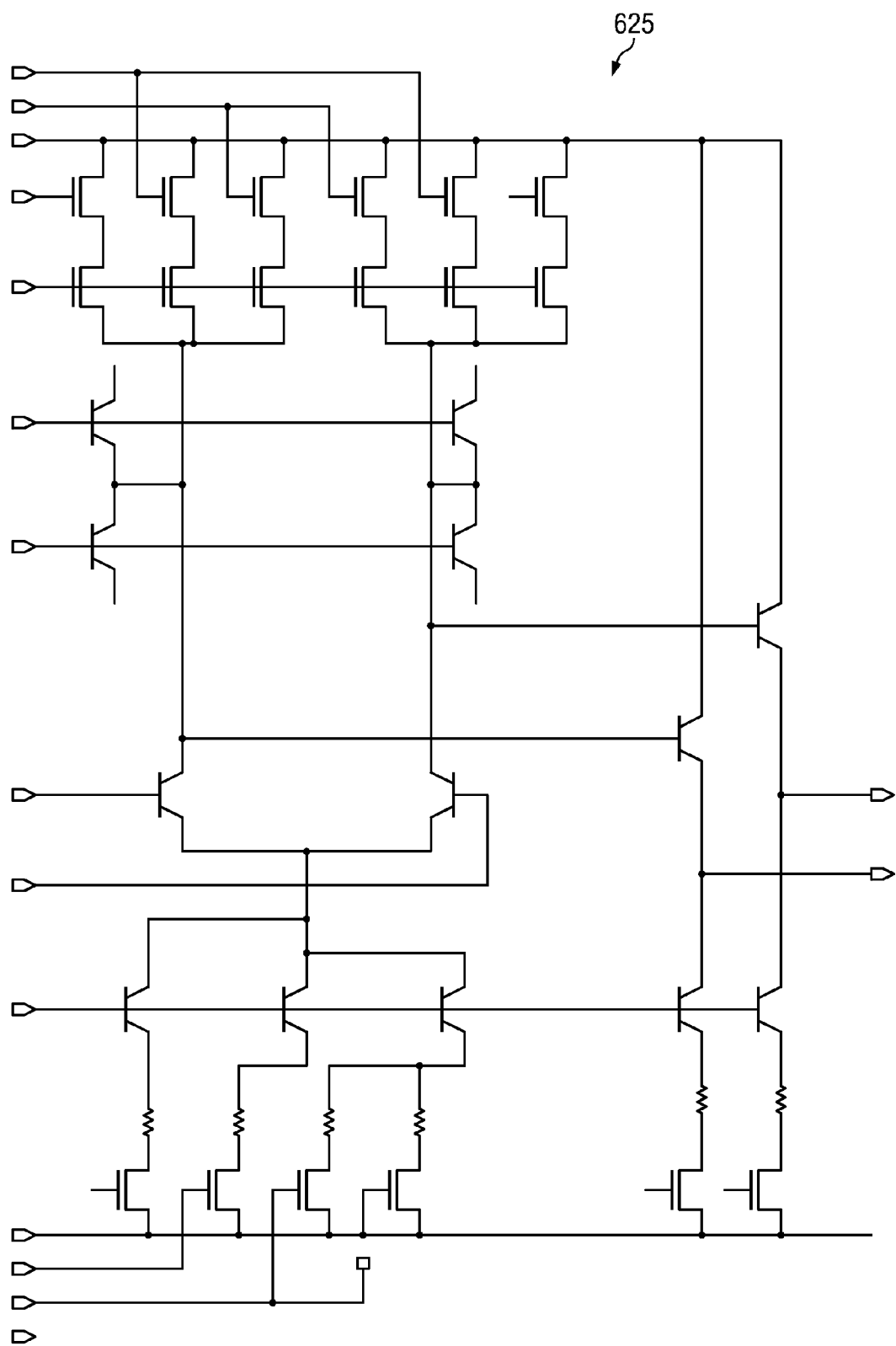

FIG. 6A is a diagram 600 illustrating one implementation of the efficient duration block 105 with eight delay stages and eight non-delay stages. This enables programmable duration signals using MOSFET switches 617 in combination with fixed capacitors 619 (see FIG. 6B). Though this implementation is shown with eight delay stages, numerous implementations may result from varying the number, type, or the like. This implementation has two parallel data paths 610, 620. The path 610 is a delayed data path, while the path 620 is a non-delayed data path. In the delayed path 610, there is a delay stage 615. Similarly, the non-delayed path 620 has a non-delay stage 625. FIGS. 6B-6C are circuit diagrams illustrating an implementation of a delay stage 610 and a non-delay stage 615. The delay stage includes switches 617 and capacitors 619. The bottom bias current and top currents implemented using MOS current sources can be programmed to vary signal time delay.

FIG. 7A is a table illustrating a scheme for regulating power and duration of the duration block 105. Each delay stage can be programmed for Fast/Medium/Slow Rise/Fall Times to generate Low/Medium/High time delays. There may be more granularity of delay settings per stage. The amount of bias current of each delay stage may be inversely proportional to the time delay, i.e., low current provides high delay. This scheme uses a gradual transition from low delay (for high data rate) to high delay (low data rate), since delay duration is inversely proportional to data rate. Hence, the bias current of each delay stage is also changed gradually (from High to Medium to Low) such that the current of any delay stage is not changed to low until the current of all other stages have been reduced to Medium.

Figure 7B:
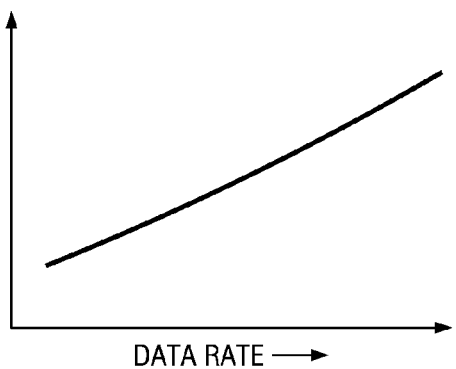
FIG. 7B is a graphical display illustrating how power consumption varies with data rate.

FIG. 7B is a graphical display illustrating how power consumption varies with data rate. This plot illustrates how using the duration block 105 and its associated delay produces greater power consumption at higher data rates. As illustrated, small delays are associated with high data rates, while large delays are associated with low data rates; these large delays are associated with small current settings and correspondingly low power consumption. Hence, the programmability scheme for this duration block results in low power consumption at low data rates, and power consumption increases as data rates increases.

Figure 8A:
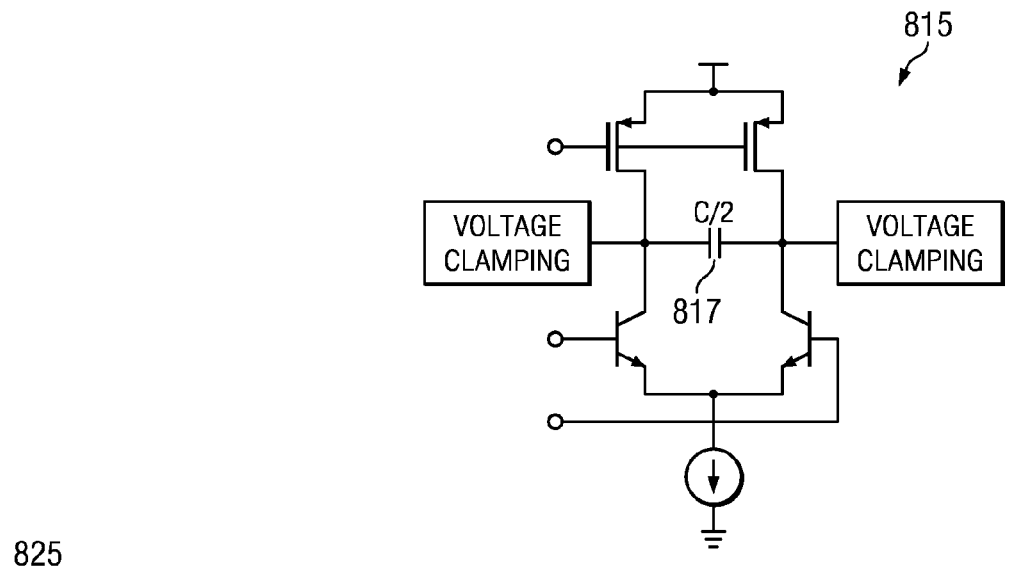
FIGS. 8A-8D are circuit diagrams illustrating alternative implementations of the delay cell of FIG. 6B.
Figure 8B:
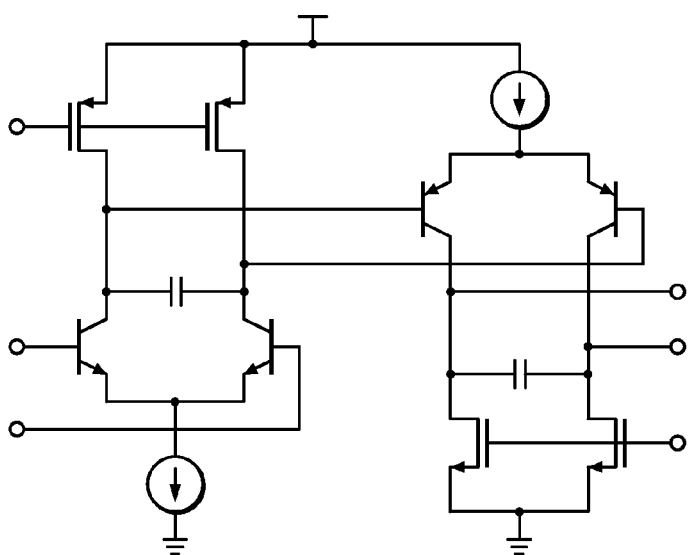

FIGS. 8A-8D are circuit diagrams illustrating alternative implementations of the delay stage 615. In FIG. 8A, the delay stage 815 is an alternative implementation that utilizes a differential capacitor arrangement with capacitor 817 instead of two single-ended capacitors. This stage implementation may produce the same signal delay as the delay stage 615, while saving area. Delay stage 825 is another implementation that uses alternating NPN-PNP stages with voltage clamping. This implementation may reduce both power and space.

Figure 8C:
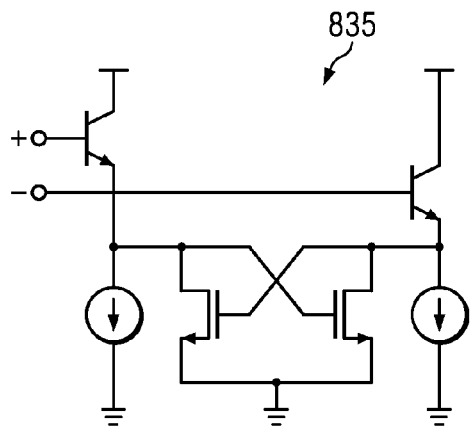
Figure 8D:
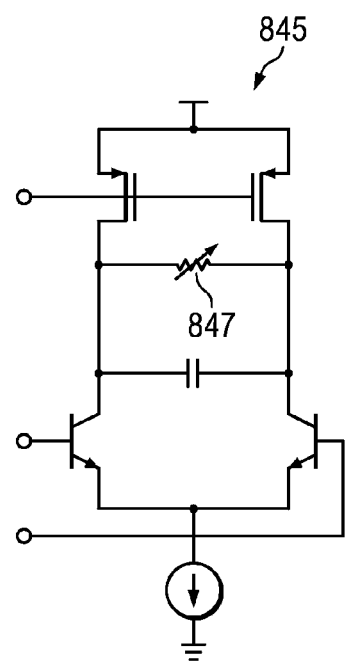

Turning to FIG. 8C, the delay stage 835 uses positive feedback at the output of the emitter-follower 618 (see FIG. 6B). For the delay stage, this positive feedback is implemented using a cross-coupled transistor pair, though other methods of implementing positive feedback are equally applicable. This implementation reduces the rise/fall time before transmitting the signal to the next stage. Alternatively, one can achieve the same rise/fall time without signal sharpening, by reducing the current consumption in the emitter follower stages. Finally, the delay stage 845 uses a programmable resistor 847 for tuning the delay. This implementation allows continuous analog tuning, which may provide larger delay tunability for each stage. This means that fewer stages may be needed, which would further reduce consumed power.

Figure 9:
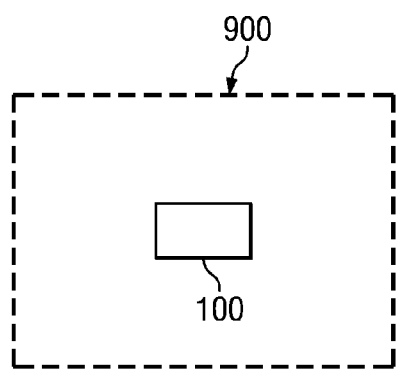
FIG. 9 is diagram of an alternative system for the RDP within a high speed line driver.

FIG. 9 is a block diagram illustrating an alternative system for RPD 100 within a high speed line driver 900. In other words, numerous alternative implementations may result from using the RPD 100 where a correlation is desired between an internal signal and an output signal. For example, one of the correlations may be Iout=X*IDC+Y*IOS, where X & Y are equal to 1 at the output, but can be fractions internally. One of the numerous applications may be a laser current driver, for example.

While various embodiments of the reduced power driver have been described, it may be apparent to those of ordinary skill in the art that many more embodiments and implementations are possible that are within the scope of this system. Although certain aspects of the reduced power driver may be described in relation to specific techniques or structures, the teachings and principles of the present system are not limited solely to such examples. All such modifications are intended to be included within the scope of this disclosure and the present reduced power driver and protected by the following claim(s). FIG. 9 is a block diagram for an alternative system for using the RPD 100

While various embodiments of the reduced power driver have been described, it may be apparent to those of ordinary skill in the art that many more embodiments and implementations are possible that are within the scope of this system. Although certain aspects of the reduced power driver may be described in relation to specific techniques or structures, the teachings and principles of the present system are not limited solely to such examples. All such modifications are intended to be included within the scope of this disclosure and the present reduced power driver and protected by the following claim(s).

The invention claimed is:

1. An apparatus comprising:
   a class AB current driver;
   a resistor that is coupled to receive a common mode voltage;
   a first switch that is coupled to the resistor;
   a first current driver that is coupled to the class AB current driver and the resistor;
   a second current driver that is coupled to the class AB current driver and the first switch;
   a second switch that is coupled to first switch and the second current driver;
   a dynamic boost circuit that is coupled to the second switch; and
   an overshoot circuit that is coupled to the dynamic boost circuit.

2. The apparatus of claim 1, wherein the dynamic boost circuit further comprises:
   a programmable switching circuit;
   a current mirror that is coupled to the programmable switching circuit, the overshoot circuit, and the second switch.

3. The apparatus of claim 2, wherein the apparatus further comprises a current source that is coupled to the class AB driver.

4. The apparatus of claim 2, wherein the resistor further comprises a first resistor, and wherein the class AB driver further comprises:
   a second resistor;
   a first diode-connected transistor that is coupled to the second resistor;
   a second diode-connected transistor that is coupled to the first diode-connected transistor;
   a first bipolar transistor that is coupled to the second resistor at its base and the first and second current drivers at it emitter;
   a second bipolar transistor that is coupled to the control electrode of the second diode connected transistor and the first and second current drivers at its emitter.

5. The apparatus of claim 4, wherein the first current driver further comprises a third bipolar transistor that is coupled to the emitters of the first and second bipolar transistors at its base and the first resistor at its collector.

6. The apparatus of claim 5, wherein the second current driver further comprises a fourth bipolar transistor that is coupled to the emitters of the first and second bipolar transistors at is base and the second switch at its collector.

7. The apparatus of claim 6, wherein the first switch further comprises a fifth bipolar transistor that is coupled to the first resistor at its base and second switch at its emitter.

8. The apparatus of claim 7, wherein the second switch further comprises a sixth bipolar transistor that is coupled to the fifth bipolar transistor, the dynamic boost circuit, and the fourth bipolar transistor at its base.

9. The apparatus of claim 8, wherein the first and second diode-connected transistors are bipolar transistors.

* * * * *